(12) United States Patent
Erstad

(10) Patent No.: US 6,833,749 B2
(45) Date of Patent: Dec. 21, 2004

(54) SYSTEM AND METHOD FOR OBTAINING HYSTERESIS THROUGH BODY SUBSTRATE CONTROL

(75) Inventor: David Owen Erstad, Minnetonka, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 10/314,708

(22) Filed: Dec. 9, 2002

(65) Prior Publication Data

US 2004/0108874 A1 Jun. 10, 2004

(51) Int. Cl.[7] .............................................. H03K 3/01
(52) U.S. Cl. ...................... 327/534; 327/537; 327/206
(58) Field of Search ................................ 327/108, 111, 327/112, 109, 534, 537, 170, 379, 389, 391, 427, 431, 434, 437, 205, 206, 581; 326/24, 27, 83

(56) References Cited

U.S. PATENT DOCUMENTS

| | | | | |
|---|---|---|---|---|
| 5,654,645 | A | 8/1997 | Lotfi ............................ | 326/24 |
| 5,796,281 | A | 8/1998 | Saeki et al. .................. | 327/206 |
| 6,124,733 | A | 9/2000 | Sharpe-Geisler ............. | 326/83 |
| 6,188,244 | B1 | 2/2001 | Joo et al. ...................... | 326/83 |
| 6,275,094 | B1 * | 8/2001 | Cranford et al. ............. | 327/534 |
| 6,304,110 | B1 * | 10/2001 | Hirano ......................... | 327/108 |
| 6,429,684 | B1 * | 8/2002 | Houston ....................... | 326/83 |
| 6,441,663 | B1 | 8/2002 | Chuang et al. .............. | 327/206 |
| 6,469,568 | B2 * | 10/2002 | Toyoyama et al. ........... | 327/534 |

FOREIGN PATENT DOCUMENTS

| | | |
|---|---|---|
| JP | 02148907 | 6/1990 |
| JP | 2-148907 | 6/1990 |
| JP | 6-324090 | 11/1994 |
| JP | 06324090 | 11/1994 |
| JP | 11-150449 | 6/1999 |
| JP | 11150449 | 6/1999 |

OTHER PUBLICATIONS

Gil et al., "A High Speed and Low Power SOI Inverter Using Active Body–Bias," Solid State Electronics, vol. 43, No. 4, p. 791–799 (1999).

* cited by examiner

Primary Examiner—Long Nguyen
(74) Attorney, Agent, or Firm—McDonnell Boehnen Hulbert & Berghoff LLP

(57) ABSTRACT

A buffer circuit is used to provide hysteresis, which can reduce the negative effects of noise in digital circuits. Reducing the number of transistors in the buffer circuit reduces the amount of space the circuit occupies and reduces power consumption. By connecting a voltage-coupling element between the body of a transistor in a first inverter and an output of a second inverter, the voltage-coupling element can control the hysteresis of the buffer circuit.

12 Claims, 5 Drawing Sheets

SYSTEM AND METHOD FOR OBTAINING HYSTERESIS THROUGH BODY SUBSTRATE CONTROL

FIELD

The present invention relates to digital circuit design. Specifically, the present invention relates to generating hysteresis in a digital circuit.

BACKGROUND

In the design of digital circuits, the noise immunity of the circuit must be considered. For example, noise in a digital circuit or system can cause a switching circuit to incorrectly transition between logic levels. One of the major contributors to noise occurring on a digital circuit is on-chip generated noise. For example, switching of the output drivers that cause voltage spikes on the power supply buses may produce the on-chip generated noise.

In addition, the operating conditions of the digital circuit can increase or reduce the amount of the generated noise. High noise operating conditions, that is, operating conditions with fast transistor parameters, such as high conductance, high power supply voltages, and low operating temperatures, increase the occurrence of the on-chip generated noise. Conversely, low noise operating conditions, that is operating conditions with slow transistor parameters, such as low conductance, low power supply voltage, and high operating temperatures, reduce the occurrence of the on-chip generated noise.

In order to reduce the negative effects of noise in digital circuits, hysteresis is often employed. Hysteresis typically includes providing a buffer with a degree of noise immunity at the expense of introducing a constant delay into the speed of the digital circuitry. For example, a non-inverting buffer with hysteresis will transition from a first logic state to a second logic state as an input signal applied to the buffer reaches a first switching threshold. To transition the non-inverting buffer from the second logic state back to the first logic state, the input signal causes a transition at a second switching threshold. The first switching threshold is chosen to be closer to the second logic state than the second switching threshold. The difference in the transition points creates hysteresis in the circuit and provides the non-inverting buffer with noise immunity and reduces the occurrence of erroneous switching.

FIG. 1 illustrates a switching circuit 100 with hysteresis. The circuit illustrates a complementary metal oxide semiconductor ("CMOS") inverter with an input signal applied to an IN1 terminal 126. The CMOS inverter includes p-channel metal oxide semiconductor field effect transistors ("MOSFETs") 104 and 106 coupled to n-channel MOSFETs 108 and 110. A supply voltage $V_{DD}$ terminal 122 is coupled to the source of the p-channel transistor 104, and a ground voltage $V_{SS}$ terminal 124 grounds the source of the n-channel transistor 110.

A feedback p-channel MOSFET 112 and a feedback n-channel MOSFET 114 are coupled to an n1 node 120. The source of the feedback n-channel transistor 114 is coupled to an n3 node 122. Further, the drain of the feedback n-channel transistor 114 is coupled to the supply voltage $V_{DD}$ terminal 122, and its gate is coupled to the n1 node 120.

Further, the source of the feedback p-channel transistor 112 is coupled to an n2 node 118. The drain of the feedback p-channel transistor 112 is grounded by the ground voltage $V_{SS}$ terminal 124, and its gate is coupled to the n1 node 120.

A CMOS inverter 116 is coupled to the n1 node 120. Although not shown in FIG. 1, the CMOS inverter 116 may include a p-channel MOSFET connected in series with an n-channel MOSFET, with the source of the p-channel MOSFET connected to the supply voltage $V_{DD}$ terminal 122, and the source of the n-channel MOSFET grounded by the ground voltage $V_{SS}$ terminal 124.

Considering the switching circuit 100 operation without the effect of the feedback p-channel transistor 112 and the feedback n-channel transistor 114, when the input signal at the IN1 terminal 126 transitions from a high level to a low level, the p-channel transistors 104 and 106 are turned on, and a current path is established between the supply voltage $V_{DD}$ terminal 122 and the n1 node 120. The current supplied by the supply voltage $V_{DD}$ terminal 122 increases the voltage of the n1 node 120, and the inverter 116 inverts the voltage at the n1 node 120. Thus, with a low level input signal applied to the IN1 terminal 126, the switching circuit 100 generates a low level output signal at the OUT1 terminal 128.

When the input signal at the IN1 terminal 126 transitions from a low level to a high level, the p-channel transistors 104 and 106 are turned off, and the n-channel transistors 108 and 110 are turned on. A current path is established between the n1 node 120 and the ground voltage $V_{SS}$ terminal 124. As the current flows to the ground voltage $V_{SS}$ terminal 124, the voltage at the n1 node 120 decreases. When the voltage level at the IN1 terminal 126 increases to a high level, the voltage at the n1 node 120 changes to a low level voltage that is then inverted by the inverter 116. Thus, with a high level input signal applied to the IN1 terminal 126, the switching circuit 100 generates a high level output signal at the OUT 1 terminal 128.

If the switching circuit 100 does not employ feedback transistors 112 and 114, and if noise is present in the circuit causing the input signal level to fluctuate during a switching event, an unstable output would be generated at the OUT1 terminal 128. To prevent unstable circuit behavior, the source of the n-channel transistor 108 and the drain of the n-channel transistor 110 are controlled by the source voltage of the feedback n-channel transistor 114. Further, the drain of the p-channel transistor 104 and the source of the p-channel transistor 106 are controlled by the source voltage of the feedback p-channel transistor 112.

When the input voltage at the IN1 terminal 126 transitions from a low voltage level to a high voltage level, the p-channel transistors 104 and 106 are turned off, and the n-channel transistors 108 and 110 are turned on. Since the feedback n-channel transistor 114 was already turned on by the previous output signal at the n1 node 120 (a high voltage signal level at the n1 node 120 caused by the low input voltage level at the IN1 terminal 126), the current flow through the feedback n-channel transistor 114 will slow the discharge from the n1 node 120 to the ground voltage $V_{SS}$ terminal 124.

Similarly, when the input voltage at the IN1 terminal 126 transitions from a high voltage level to a low voltage level, the n-channel transistors 108 and 110 are turned off, and the p-channel transistors 104 and 106 are turned on. Since the feedback p-channel transistor 112 was already turned on by the previous output signal at the n1 node 120 (a low voltage signal level at the n1 node 120 caused by the high voltage level at the IN1 terminal 126), the current flow through the feedback p-channel transistor 112 will slow the charging of n1 node 120 from the supply voltage $V_{DD}$ terminal 122.

Thus, when the input signal at the input IN1 terminal 126 transitions from a high voltage level to a low level, hysteresis is provided by the feedback p-channel transistor 112 and, when the input signal at the IN1 terminal 126 transitions from a low voltage level to a high level, hysteresis is provided by the feedback n-channel transistor 114.

The prior art circuit illustrated in FIG. 1, as well as other commonly used circuits with hysteresis, may be complex as they may include additional circuitry for creating input thresholds that vary depending on the current state of the circuit and, thus, may have circuit areas and power consumption higher that those desired by many applications. Thus, there is an apparent need for a simple and low-power consumption circuit with hysteresis.

BRIEF DESCRIPTION OF THE DRAWINGS

An exemplary embodiment of the present invention is described below with reference to the drawings, in which.

DETAILED DESCRIPTION

Figure 1:
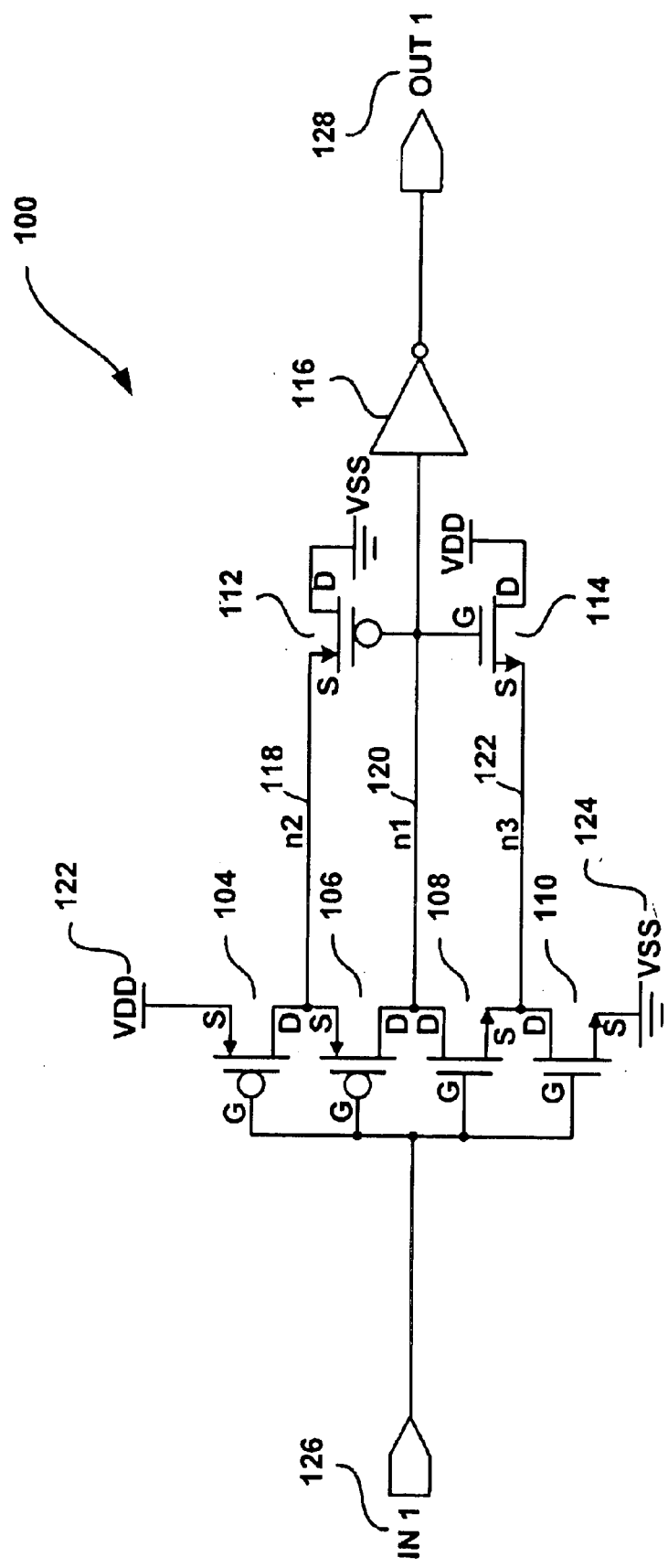
FIG. 1 is a circuit diagram illustrating a buffer circuit with hysteresis according to one existing prior art implementation.
Figure 2:
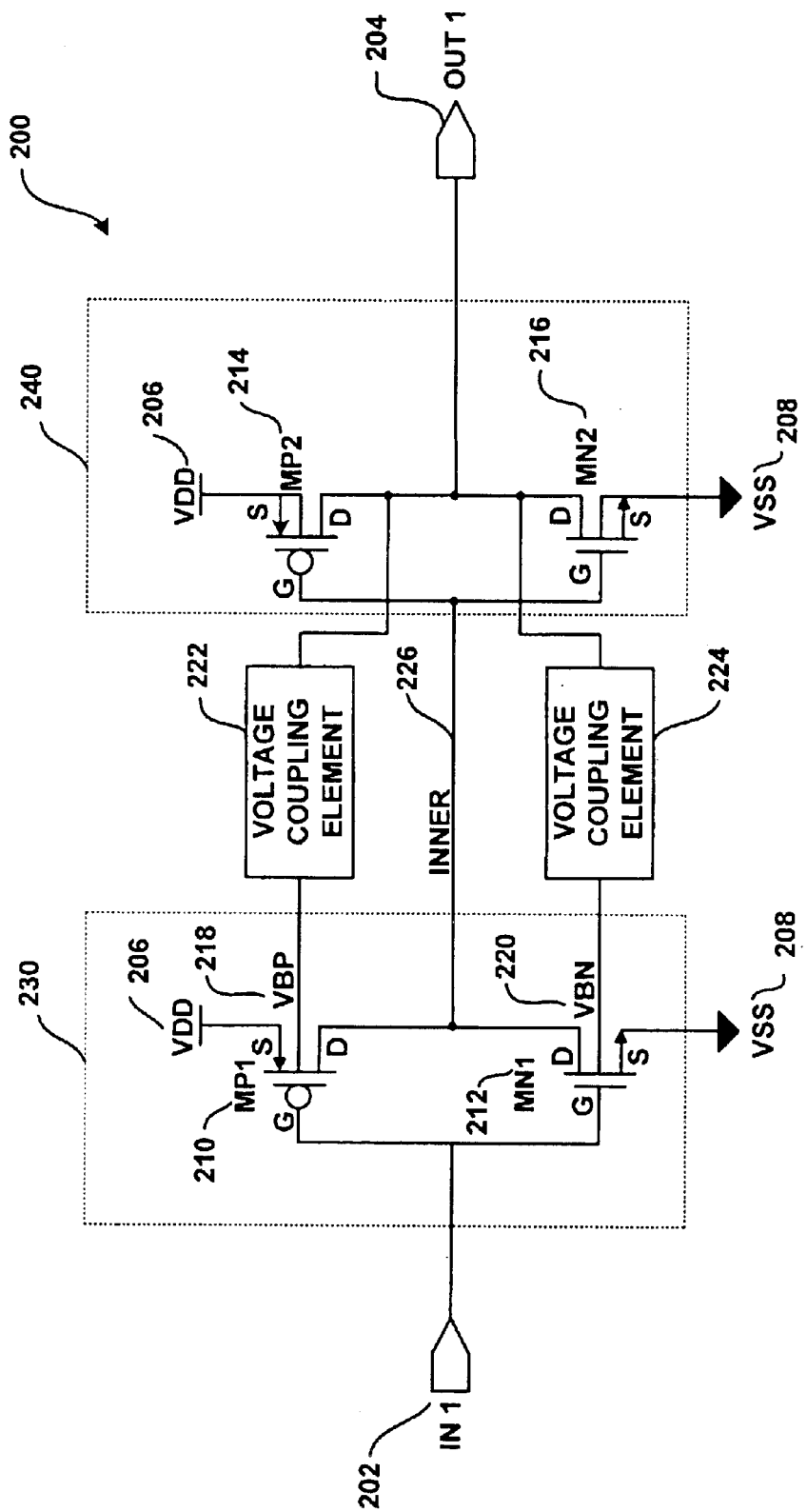
FIG. 2 is a circuit diagram illustrating buffer circuit with hysteresis according to one exemplary embodiment.

FIG. 2 illustrates a hysteresis buffer circuit 200 according to one embodiment of the invention. As shown therein, the hysteresis buffer includes two inverters, a first inverter 230 and a second inverter 240, connected in series.

The first inverter 230 with an IN1 terminal 202 includes a p-channel MOSFET transistor MP1 210 and an n-channel MOSFET transistor MN1 212. A supply voltage $V_{DD}$ terminal 206 is coupled to the source of the p-channel transistor 210, and a $V_{SS}$ voltage terminal 208 is coupled to the source of the n-channel transistor 212. In one embodiment, the $V_{SS}$ voltage terminal 208 may provide a predetermined positive or negative voltage to the source of the n-channel transistor 212. However, in the exemplary embodiment, the $V_{SS}$ voltage terminal 208 is grounded. The drains of the n-channel transistor 212 and the p-channel transistor 210 are coupled to the second inverter 240, thus, providing an input signal to the second inverter 240, illustrated as an inner signal node 226.

The second inverter 240 includes a p-channel MOSFET transistor MP2 214 coupled to an n-channel MOSFET transistor MN2 216. The supply voltage $V_{DD}$ terminal 206 is coupled to the source of the p-channel transistor 214. The body substrate of the p-channel transistor 214 is connected to an appropriate voltage, typically the supply voltage $V_{dd}$ terminal 206 as shown in FIG. 2. Similarly, the $V_{SS}$ voltage terminal 208 is coupled to the source of the n-channel transistor 216. The body substrate of the n-channel transistor 216 is connected to an appropriate voltage, typically the VSS voltage terminal 208. According to the embodiment illustrated in FIG. 2, the second inverter 240 inverts the signal at the inner signal node 226 received from the first inverter 230, producing a signal at an OUT1 terminal 204.

Further, as illustrated in FIG. 2, the body substrate of the p-channel transistor 210 and the n-channel transistor 212 of the first inverter 230 are coupled to the OUT1 terminal 204 of the second inverter 240. In one embodiment, the body substrate of the p-channel transistor 210 is coupled to the OUT1 terminal 204 via a first coupling element, such as a first voltage-coupling element 222, and the body substrate of the n-channel transistor 212 is coupled to the OUT1 terminal 204 via a second coupling element, such as a second voltage-coupling element 224.

As is known in the art, a threshold voltage is the gate voltage required to turn on a transistor. The threshold voltage typically depends on the body substrate voltage of the transistor and determines the drive of the transistor. According to the embodiment illustrated in FIG. 2, a body voltage VBP 218 of the p-channel transistor 210 and a body voltage VBN 220 of the n-channel transistor 212 are coupled to the OUT1 terminal 204 of the second inverter 240 via the voltage-coupling elements 222 and 224. By tying the body substrates of the first inverter 230 to the OUT1 terminal 204, the body bias characteristics are directly set by the device characteristics rather than by the supply voltage $V_{DD}$ terminal 206 and the $V_{SS}$ voltage terminal 208.

Figure 3:
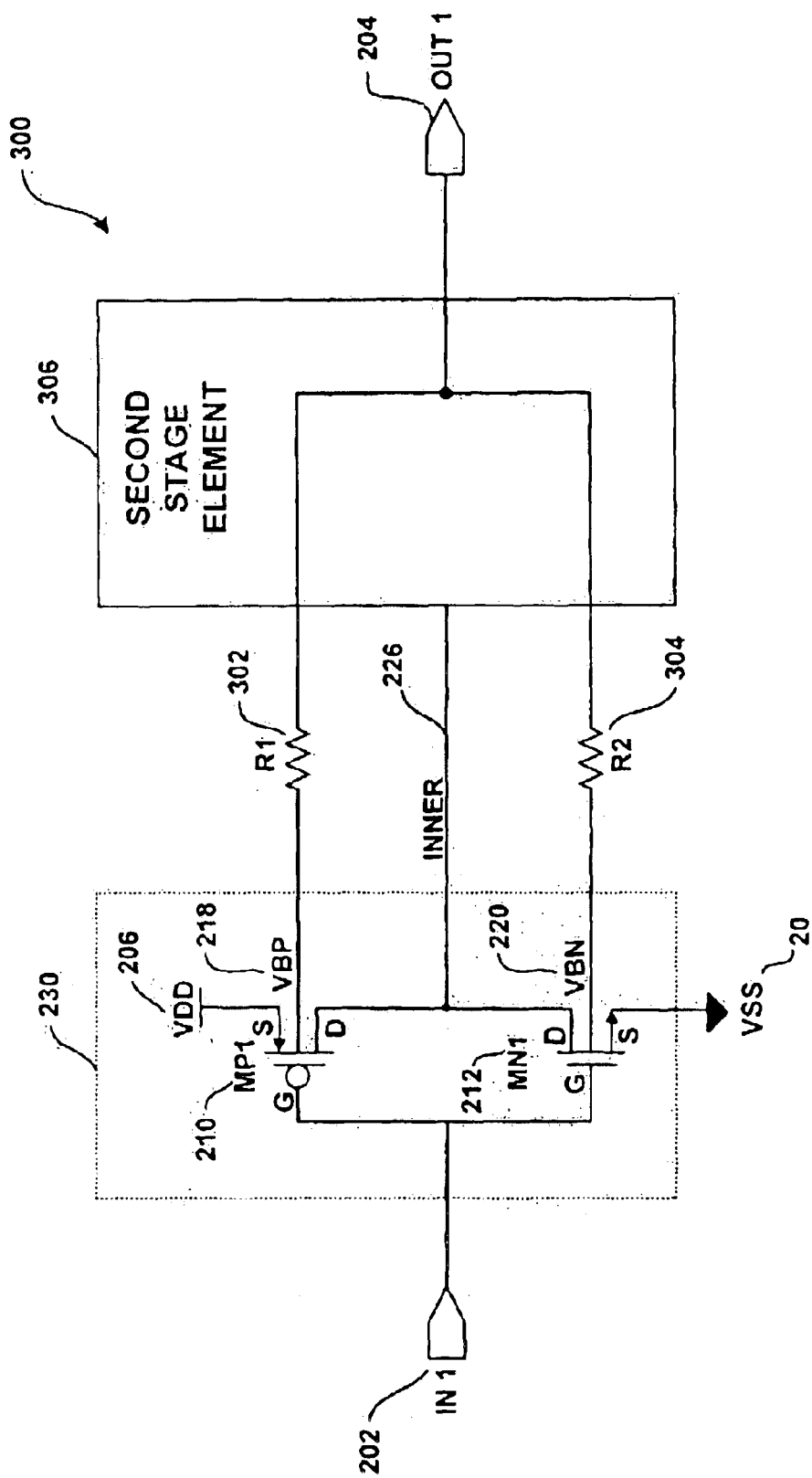
FIG. 3 is a circuit diagram illustrating a buffer circuit with hysteresis according to another exemplary embodiment.

FIG. 3 illustrates another exemplary embodiment of a hysteresis buffer circuit 300. As illustrated in the buffer circuit 300, the voltage-coupling elements 222 and 224 may include resistors R1 302 and R2 304. R1 302 and R2 304 provide a bias voltage from the OUT1 terminal 204 to the body substrates of the p-channel transistor 210 and the n-channel transistor 212.

The buffer circuit 300 may be optimized by selecting resistance values of the R1 302 and the R2 304 that provide a proper balance between the amount and efficacy of hysteresis against the DC power consumption. The voltage-coupling elements 222 and 224 are not limited to the use of resistors. The coupling elements may include different types of electronic devices for voltage coupling, such as transistors and diodes.

Figure 4:
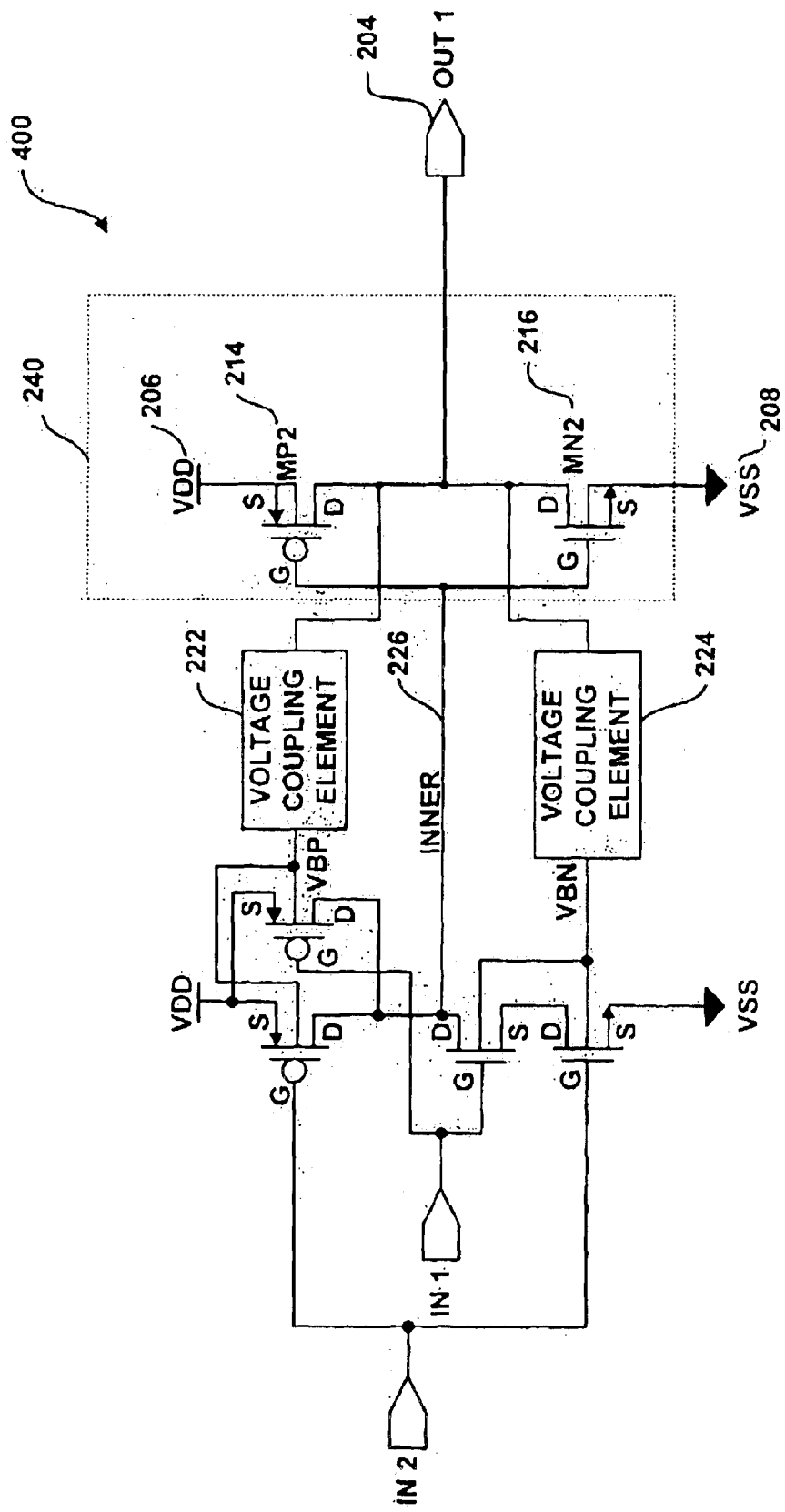
FIG. 4 is a circuit diagram illustrating a buffer circuit with hysteresis in which a first stage element provides NAND logic function.
Figure 5:
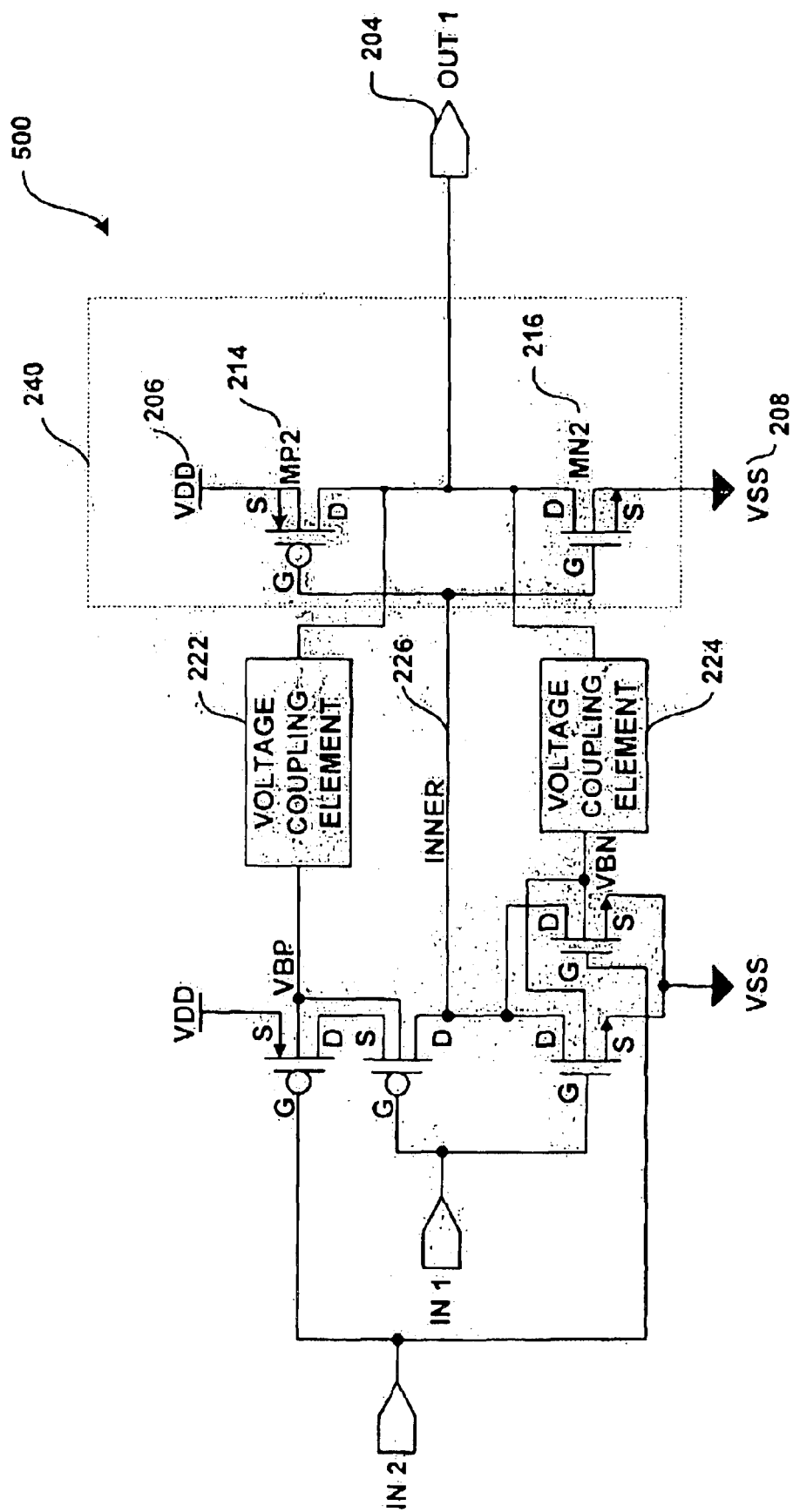
FIG. 5 is a circuit diagram illustrating a buffer circuit with hysteresis in which a first stage element provides a NOR logic function.

Further, it should be understood that the exemplary embodiments of the buffer circuits are not limited to the use of two voltage-coupling elements. Referring back to FIG. 2, the buffer circuit 200 may include a single coupling element, either voltage-coupling element 222 or voltage-coupling element 224. Additionally, it should be understood that the inverter circuits illustrated in FIG. 2 may be replaced with other logic functions, such as a NAND and NOR functions, and are not limited to the inverter logic function. For example, FIG. 3 shows a second stage element 306. The second stage element 306 may provide an inverter logic function, such as the second inverter 240 depicted in FIG. 2, a NAND logic function, or a NOR logic function. As seen in FIG. 3, the OUT1 terminal 204 may be connected to the voltage-coupling elements regardless of what logic function is provided by the second stage element 306. Additionally, FIG. 4 is a circuit diagram of a buffer circuit 400 in which the first stage element provides a NAND logic function and FIG. 5 is a circuit diagram of a buffer circuit 500 in which the first stage element provides a NOR logic function. It should be understood that exemplary embodiments are not limited to cases in which all transistor bodies are controlled provide hysteresis.

Referring back to FIG. 2, when the signal at the IN1 terminal 202 is high, typically representing a logical 1, the p-channel transistor 210 is turned off, and the n-channel transistor 212 is turned on. In such an embodiment, a current path is established from the inner signal node 226 and the $V_{ss}$ voltage terminal 208, such as the ground voltage terminal. With the n-channel transistor 212 conducting, the voltage on the inner signal node 226 is low, thus, providing low voltage level as an input to the second inverter 240.

When the low voltage signal is provided to the second inverter 240, the p-channel transistor 214 turns on, and the n-channel transistor 216 turns off. When the p-channel channel transistor 214 is conducting, a current path is established between the supply voltage $V_{DD}$ terminal 206 and the output OUT1 terminal 204, and the current increases the voltage of the output OUT1 node to approximately the $V_{DD}$ value.

Thus, with a high level input signal at the IN1 terminal 202, the buffer circuits 200 and 300 generate a high level output signal at the OUT1 terminal 204. In a steady state, the body voltage 218 of the p-channel transistor 210 will increase approximately to the $V_{DD}$ value, depending on the device employed in the voltage coupling element 222, such as the value of the resistor R1 302, as illustrated as the voltage-coupling element in FIG. 3.

Further, the body voltage 220 of the n-channel transistor 212 will increase to approximately a diode drop above the $V_{SS}$ voltage terminal 208 level. If the $V_{SS}$ voltage terminal 208 is grounded, the body voltage 220 increases to approximately a diode drop above the ground. The parasitic body-source diode in the n-channel transistor 212 prevents the body voltage 220 from decreasing all the way to $V_{SS}$ voltage terminal 208 level.

The body voltage 220 reduces the threshold voltage of the n-channel transistor 212. There is also a bipolar enhancement of the n-channel drain current due to the parasitic npn bipolar transistor contained within the n-channel transistor 212. These two effects increase the drive strength of the n-channel transistor 212 relative to the p-channel transistor 210, and lowers the switch-point of the first inverter 230, thus, creating hysteresis for the rising input signal transition.

During a low to high switching event, the first switching threshold of the input voltage at the IN1 terminal 202 is higher than the switching threshold after the OUT1 terminal 204 begins to switch. Thus if the input signal at the IN1 terminal 202 rises above the first switching threshold, a transition will occur at the OUT1 terminal. However, a subsequent minor perturbation of the signal at the IN1 terminal 202 that results in the signal falling below the first switching threshold, but above the second switching threshold, will not result in a transition on the output.

When the input at the IN1 terminal 202 switches low, typically representing logical 0, the n-channel transistor 212 is turned off, and the p-channel transistor 210 is turned on. In such an embodiment, a current path is established from the supply voltage $V_{DD}$ terminal 206 to the inner signal node 226. With the p-channel transistor 210 conducting, the voltage on the inner signal node 226 is at a high voltage level, typically representing a logical 1. When the voltage on the inner signal node 226 is high, thus, providing the high voltage level as an input to the second inverter 240, the p-channel transistor 214 is turned off, and the n-channel transistor 216 is turned on.

When the n-channel transistor 216 is conducting, a current path is established between the OUT1 terminal 204 and the $V_{SS}$ voltage terminal 208, such as a ground node. After a short delay, the voltage at the OUT1 terminal 204 falls to approximately the $V_{SS}$ value, such as a logical 0 if the $V_{SS}$ terminal is grounded. When the output of the OUT1 terminal 204 is low, the body voltage 220 of the n-channel transistor 212 falls to a low voltage level, restoring the normal threshold value of the n-channel transistor 212 and removing the bipolar effect.

Further, the body voltage 218 of the p-channel transistor 210 falls to approximately a diode drop below the supply voltage $V_{DD}$ terminal 206, causing the threshold voltage of the p-channel transistor 210 to increase (i.e., moving it towards zero voltage), and also providing a bipolar gain. These effects increase the relative drive of the p-channel transistor 210 compared to the n-channel transistor 212 and increase the switch-point of the first inverter 230. This creates the hysteresis effect for the falling signal transition.

Accordingly, the exemplary hysteresis buffer circuits are simpler than existing circuits. For example, the circuit illustrated in FIG. 2 employs only four transistors, and a reduction in the number of transistors leads to a reduction in a circuit area and power consumption versus existing hysteresis circuit implementations.

It should be understood that the above-described arrangements are simply illustrative of the application of principles of the present invention, and numerous arrangements may be readily devised by those skilled in the art.

I claim:

1. A buffer circuit, comprising in combination:
    a first stage element that receives at least one input signal and generates at least one intermediate signal having hysteresis characteristics;
    a second stage element receiving the at least one intermediate signal from the first stage element, wherein the second stage element generates an output signal at an output terminal based on the at least one intermediate signal; and
    at least one coupling element connected to the output terminal of the second stage element and at least one body terminal of the first stage element, wherein the at least one coupling element comprises at least one resistor, wherein the at least one resistor provides a conduction path capable of providing a bias voltage from the output signal to the at least one body terminal of the first stage element, thereby controlling the hysteresis characteristics of the at least one intermediate signal.

2. The buffer circuit of claim 1, wherein the first stage element includes a first logic circuit, and the second stage element includes a second logic circuit.

3. The buffer circuit of claim 2, wherein the first logic circuit comprises a first inverter, and the second logic circuit comprises a second inverter, wherein the first inverter is coupled in series to the second inverter.

4. The buffer circuit of claim 3, wherein the first inverter includes a first pair of p-channel and n-channel transistors, and wherein an output terminal of the second inverter is connected to a body terminal of the p-channel transistor via the at least one resistor.

5. The buffer circuit of claim 3, wherein the first inverter includes a first pair of p-channel and n-channel transistors, and wherein an output terminal of the second inverter is connected to a body terminal of the n-channel transistor via the at least one resistor.

6. The buffer circuit of claim 3, wherein the first inverter includes a first pair of p-channel and n-channel transistors, and the at least one resistor comprises a first resistor and a second resistor, the first resistor coupling an output terminal of the second inverter to body terminal of the p-channel transistor, and the second resistor coupling the output terminal of the second inverter to a body terminal of the n-channel transistor.

7. The buffer circuit of claim 2, wherein the first logic circuit provides a logic function selected from the group consisting of inverter, NOR, and NAND.

8. The buffer circuit of claim 2, wherein the second logic circuit provides a logic function selected from the group consisting of inverter, NOR, and NAND.

9. A buffer circuit, comprising in combination:
- a first inverter that receives an input signal and generates a first output signal, wherein the first output signal is an inverted input signal having hysteresis characteristics, and wherein the first inverter comprises a first pair of n-channel and p-channel transistors for receiving the input signal;
- a second inverter that receives the first output signal from the first inverter and generates a second output signal, wherein the second output signal is an inverted first output signal, wherein the second inverter comprises a second pair of n-channel and p-channel transistors for receiving the first output signal from the first inverter; and
- at least one coupling element coupled to the second output signal of the second inverter, wherein the at least one coupling element comprises at least one resistor, wherein the at least one resistor provides a conduction path capable of providing a bias voltage from the second output signal to at least one body terminal of the first pair of n-channel and p-channel transistors.

10. The buffer circuit of claim 9, wherein the at least one resistor is coupled between the second output signal and the n-channel transistor of the first inverter, thereby providing bias to the n-channel transistor and controlling the hysteresis characteristics of the first output signal.

11. The buffer circuit of claim 9, wherein the at least one resistor is coupled between the second output signal and the p-channel transistor of the first inverter, thereby providing bias to the p-channel transistor and controlling the hysteresis characteristics of the first output signal.

12. A method for controlling hysteresis in a buffer circuit, comprising connecting at least one coupling element between a body of a transistor in a first inverter and an output of a second inverter, wherein the at least one coupling element comprises at least one resistor, whereby the at least one resistor provides a conduction path capable of providing a bias voltage from the output of the second inverter to the body of the transistor in the first inverter.

* * * * *

UNITED STATES PATENT AND TRADEMARK OFFICE
CERTIFICATE OF CORRECTION

PATENT NO.   : 6,833,749 B2
DATED        : December 21, 2004
INVENTOR(S)  : David Owen Erstad It is certified that error appears in the above-identified patent and that said Letters Patent is hereby corrected as shown below:

Column 4,
Line 59, please replace "controlled" with -- controlled to --.
Line 67, please replace "transistor. 212" with -- transistor 212 --.

Column 6,
Line 61, please replace "to body" with -- to a body --.

Signed and Sealed this

Nineteenth Day of April, 2005

JON W. DUDAS
*Director of the United States Patent and Trademark Office*